US012751214B2

(12) United States Patent
Mergenthaler et al.

(10) Patent No.: US 12,751,214 B2
(45) Date of Patent: Sep. 29, 2026

(54) SUPERCONDUCTING SILICON TRANSISTOR AND FABRICATION THEREOF

(71) Applicant: INTERNATIONAL BUSINESS MACHINES CORPORATION, Armonk, NY (US)

(72) Inventors: Matthias Mergenthaler, Zurich (CH); Fabrizio Nichele, Zurich (CH); Markus Fabian Ritter, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 287 days.

(21) Appl. No.: 17/707,898

(22) Filed: Mar. 29, 2022

(65) Prior Publication Data

US 2023/0320235 A1 Oct. 5, 2023

(51) Int. Cl.
*H10N 60/10* (2023.01)
*H10N 60/01* (2023.01)
*H10N 60/12* (2023.01)

(52) U.S. Cl.
CPC ....... *H10N 60/128* (2023.02); *H10N 60/0912* (2023.02); *H10N 60/12* (2023.02)

(58) Field of Classification Search
CPC .. H10N 60/128; H10N 60/0912; H10N 60/12; G06N 10/40
See application file for complete search history.

(56) References Cited

U.S. PATENT DOCUMENTS

| | | | | |
|---|---|---|---|---|
| 5,663,081 | A | 9/1997 | Sung et al. | |
| 9,455,393 | B1 | 9/2016 | Bodke | |
| 2012/0219824 | A1* | 8/2012 | Prolier | C23C 16/42 428/662 |
| 2019/0288177 | A1* | 9/2019 | Fong | H10N 60/85 |
| 2020/0161422 | A1* | 5/2020 | Nemouchi | H10D 64/668 |
| 2020/0258984 | A1* | 8/2020 | George | H10D 64/01 |
| 2020/0287119 | A1* | 9/2020 | Black | B82Y 40/00 |
| 2020/0328339 | A1* | 10/2020 | Shabani | H10N 60/0912 |

(Continued)

FOREIGN PATENT DOCUMENTS

| | | | |
|---|---|---|---|
| JP | 61201467 | A | 9/1986 |
| JP | 62057260 | A | 3/1987 |
| JP | 62122287 | A | 6/1987 |

(Continued)

OTHER PUBLICATIONS

Carrier charging effect of V3Si nanocrystals floating gate memory structure (Year: 2012).*

(Continued)

*Primary Examiner* — Fernando L Toledo
*Assistant Examiner* — Marshall Mu-Nuo Hatfield
(74) *Attorney, Agent, or Firm* — Amin, Turocy & Watson, LLP

(57) ABSTRACT

A superconductor device includes a substrate. There is a first silicide and a second silicide located on opposite sides of a silicon channel and on top of the substrate. A first superconducting contact is in contact with the first silicide. A second superconducting contact is in contact with the second silicide. A dielectric is located between the first and second superconducting contacts. A gate is on top of the gate dielectric.

20 Claims, 10 Drawing Sheets

(56) References Cited

U.S. PATENT DOCUMENTS

2023/0060817 A1* 3/2023 Nemouchi ............. H10N 60/12

FOREIGN PATENT DOCUMENTS

| | | | |
|---|---|---|---|
| JP | 63029594 | A | 2/1988 |
| JP | H01259581 | A | 10/1989 |
| JP | H04167573 | A | 6/1992 |
| JP | 3413701 | B2 | 6/2003 |

OTHER PUBLICATIONS

International Search Report and Written Opinion issued Jul. 7, 2023 in related application No. PCT/EP2023/057774, 10 pgs.
Kuhlmann, A. V., et al., "Ambipolar Quantum Dots in Undoped Silicon fin Field-Effect Transistors"; arXiv:1807.04121v1 [cond-mat.mes-hall] (2018); 5 pgs.
Drachmann, A. et al., "Proximity Effect Transfer from NbTi into a Semiconductor Heterostructure via Epitaxial Aluminum"; NANO Letters (2017); pp. 1200-1203.
Aggarwal, K. et al., "Enhancement of Proximity-Induced Superconductivity in a Planar Ge Hole Gas"; Physical Review Research (2021); vol. 3, L022005, 7 pgs.
Francheteau, A., "Superconducting Silicon on Insulator and Silicide-Based Superconducting MOSFET for Quantum Technologies" , PhD Thesis, University of Grenoble Alpes (2017), Grenoble, France 153 pgs.

* cited by examiner

SUPERCONDUCTING SILICON TRANSISTOR AND FABRICATION THEREOF

STATEMENT REGARDING GOVERNMENT SPONSORED RESEARCH OR DEVELOPMENT

This application was made with government support under the European Union's Horizon 2020 research and innovation program under the Marie Sklodowska-Curie grant agreement No. 899018. The government has certain rights to this invention.

BACKGROUND

Technical Field

The present disclosure generally relates to high performance and quantum transistor devices, and more particularly, to superconducting structures and methods of creation thereof.

Description of the Related Art

Superconductivity relates to physical properties exhibited in certain materials where the electrical resistance is substantially reduced and the magnetic field fluxes are removed from the material. A superconductor has a characteristic critical temperature below which its resistance drops substantially to zero. Superconductors are instrumental in providing various components that are salient to quantum computing, including fast Josephson junction (JJ) switches and various other superconducting circuits.

While superconductivity of various materials, including metal silicides (e.g., platinum silicide (PtSi), vanadium silicide (VSi), molybdenum silicide (MoSi), cobalt silicide (CoSi), etc.,) is demonstrated, a superconducting silicon (Si) transistor using superconducting metal silicides has remained elusive. Indeed, most superconducting silicides are challenging to fabricate, typically involving high annealing temperature or co-deposition of two materials, are sensitive to stoichiometry, and have multiple crystal phases. Even the aforementioned promising silicides such as PtSi and CoSi are weak superconductors and have work functions (~5 eV, e.g., 4.7 eV to 5.2 eV) that limit their operation to the hole regime. Low mobility of holes, compared to electrons, in silicon (Si) potentially prevents realization of a supercurrent in the transistor channel.

SUMMARY

According to an embodiment, a superconductor device includes a substrate. A first silicide and a second silicide are located on opposite sides of a silicon channel and on top of the substrate. A first superconducting contact is in contact with the first silicide. A second superconducting contact is in contact with the second silicide. A dielectric is located between the first and second superconducting contacts. A gate is in contact with the gate dielectric. By virtue of this structure, the superconducting device can implement a superconducting transistor that can be tuned between superconducting and insulating stage with a gate voltage. The superconducting transistor can carry a supercurrent in its channel region.

In one embodiment, the substrate comprises intrinsic silicon.

In one embodiment, the first silicide and the second silicide comprise nickel silicide $Pt_xSi_y$, $Co_xSi_y$, $Ni_xSi_y$, $Mo_xSi_y$, $V_xSi_y$, $Ti_xSi_y$, $Sm_xSi_y$, $Er_xSi_y$, $Yb_xSi_y$, $Y_xSi_y$, or $Zr_xSi_y$.

In one embodiment, the first silicide is a source and the second silicide is a drain of the superconductor device.

In one embodiment, the first superconducting contact and the second superconducting contact have a critical temperature Tc above 1K.

In one embodiment, the first superconducting contact and the second superconducting contact comprise at least one of niobium (Nb), niobium nitride (NbN), titanium nitride (TiN), aluminum (Al), vanadium (V), and the gate comprises at least one of platinum (Pt), Gold (Au), titanium nitride (TiN), or palladium (Pd).

In one embodiment, the superconductor device represents a Josephson junction (JJ) having a gate-tunable critical current.

In one embodiment, a width of a channel region between the first and second silicides is 100 nm or less.

According to one embodiment, a method of fabricating a superconducting transistor, includes providing a substrate. A first metal and a second metal are provided on sides of a silicon channel and on top of the substrate. The first metal and the second metal are annealed to form a first silicide and a second silicide. A first superconducting contact is provided on top of the first silicide and a second superconducting contact on top of the second silicide. A dielectric is provided above the silicon channel and between the first and second superconducting contacts. A gate is provided on top of the gate dielectric. By virtue of depositing the superconducting contact after the metal is annealed to become a silicide, the superconducting contacts are less fragile.

In one embodiment, the substrate comprises intrinsic silicon.

In one embodiment, the first silicide and the second silicide comprise $Pt_xSi_y$, $Co_xSi_y$, $Ni_xSi_y$, $Mo_xSi_y$, $V_xSi_y$, $Ti_xSi_y$, $Sm_xSi_y$, $Er_xSi_y$, $Yb_xSi_y$, $Y_xSi_y$, or $Zr_xSi_y$. The first silicide is a source and the second silicide is a drain of the superconductor device.

In one embodiment, the first superconducting contact and the second superconducting contact have a critical temperature $T_c$ above 1K.

In one embodiment, the first superconducting contact and the second superconducting contact comprise at least one of niobium (Nb), niobium nitride (NbN), titanium nitride (TiN), aluminum (Al), vanadium (V). The gate comprises at least one of platinum (Pt), titanium nitride (TiN), or palladium (Pd).

In one embodiment, a width of a channel region between the first and second silicides is 100 nm or less.

In one embodiment, the silicon channel is protected by providing a silicon oxide layer on top of the substrate. Portions of the silicon oxide layer are removed. The first metal and the second metal on the sides of a silicon channel are provided in the removed portions.

In one embodiment, the superconductor device is fabricated in a complementary metal oxide semiconductor (CMOS) process. By virtue of being CMOS compatible, the manufacturing cost is substantially reduced and facilitates the creation of various circuits and structures discussed herein.

According to one embodiment, a method of fabricating a superconducting transistor, includes providing a first metal and a first superconducting contact on top of a substrate a first side of a silicon channel and a second metal and a second superconducting contact on top of the substrate and a second side of the silicon channel. The first metal and the second metal are annealed to form a first silicide and a second silicide, concurrently with the first superconducting contact and the second superconducting contact. A dielectric is provided above the silicon channel and between the first and second superconducting contacts. A gate is provided on top of the gate dielectric. By virtue of providing the first metal, the second metal, the first superconducting contact and the second superconducting contact at the same time and then annealing concurrently, the manufacturing complexity and cost are reduced.

In one embodiment, the first superconducting contact and the second superconducting contact comprise at least one of niobium (Nb), niobium nitride (NbN), titanium nitride (TiN), aluminum (Al), vanadium (V). The gate comprises at least one of platinum (Pt), titanium nitride (TiN), palladium (Pd), or gold (Au).

In one embodiment, a width of a channel region between the first and second silicides is 100 nm or less.

In one embodiment, the superconductor device is fabricated in a complementary metal oxide semiconductor (CMOS) process.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
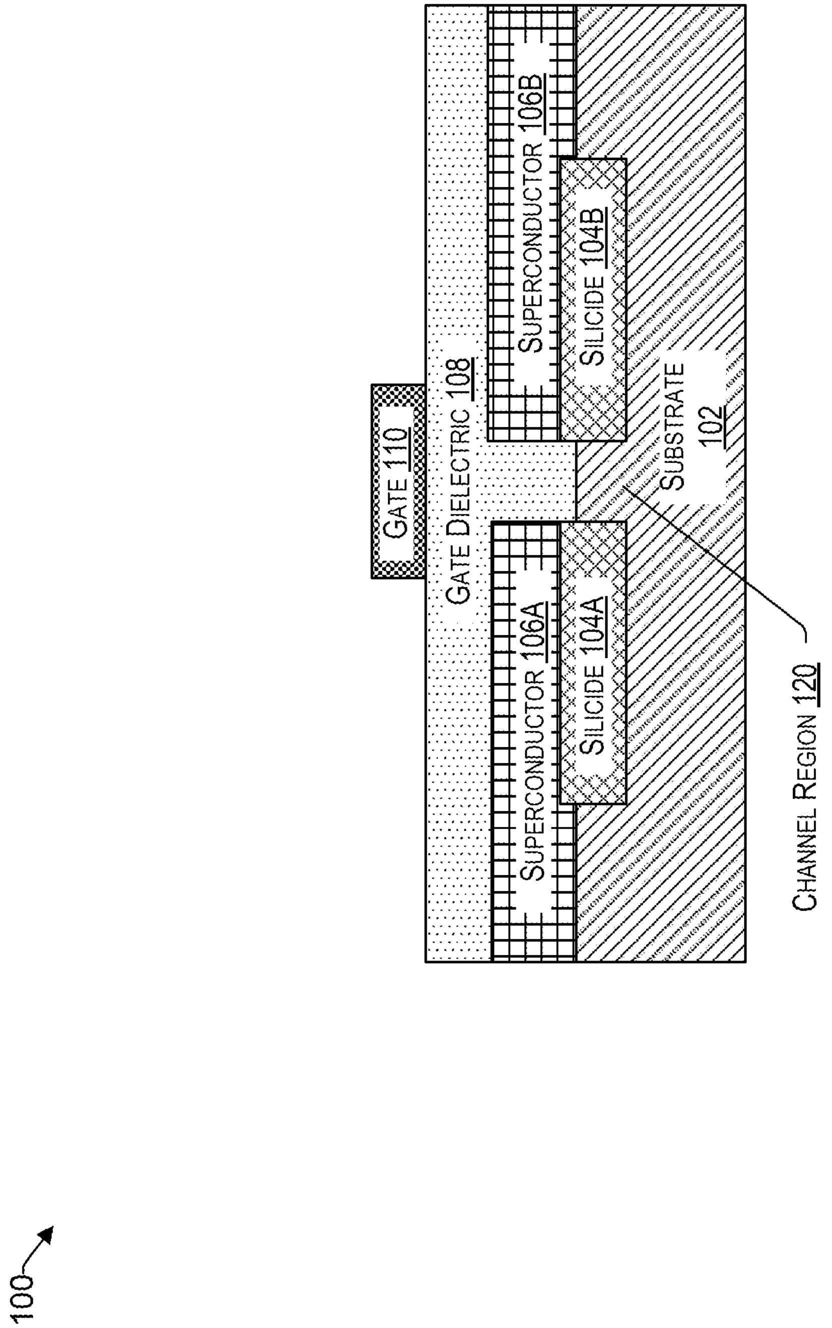
FIG. 1 provides a semiconductor structure having a first superconductor layer on top of a substrate, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein can relate to quantum technology and quantum chips. Regarding quantum technology, the electromagnetic energy associated with a qubit can be stored, for example, in so-called Josephson junctions and in the capacitive and inductive elements that are used to form the qubit. In other examples, there may be spin qubits coupled to resonators or topological qubits, microfabricated ion traps, etc. Other types of superconducting components are supported by the teachings herein as well, including (without limitation), Josephson junctions (JJ) having a gate-tunable critical current, JJ with non-sinusoidal current-phase relation, gate-tunable couplers between qubits (e.g., spin-qubits, superconducting qubits, Andreev qubits, etc.), transmons with gate tunable Josephson energy ($E_J$) (Gatemon) for an all-electric qubit control on a silicon (Si) platform, circulators, isolators, amplifiers, filters, gate-tunable resonators, weak links for Andreev qubits, active control electronics such as rapid single flux quantum (RSFQ), photodetectors, single microwave photon source, low power CMOS technology, control electronics for quantum applications, etc. Accordingly, the transistors described herein can be used as components for various structures of quantum chips and others.

For example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). The transistors described herein can be part of circuits that can be used to measure this weak signal. For example, low-noise quantum-limited amplifiers (QLAs), such as Josephson amplifiers and travelling-wave parametric amplifiers (TWPAs), may be used as preamplifiers at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

The teachings herein provide a superconducting silicon transistor device as well as the manufacture thereof. In one aspect, a transistor channel is contacted with work function matched silicide contacts to allow for operation in the electron regime (i.e., n-type conduction regime). The silicide contacts may be contacted with a large gap superconductor to induce superconductivity in the contacts and consequently in the transistor channel. Such superconducting silicon transistor device can be tuned between superconducting and insulating stage with a gate voltage. The superconducting transistor can carry a supercurrent in its channel region. In one aspect, the device fabrication is fully complementary metal oxide semiconductor (CMOS) compatible. The techniques described herein may be implemented in a number of ways. Example implementations are provided below with reference to the following figures.

Example Superconducting Structure

Reference now is made to FIG. 1, which is a simplified cross-section view of a superconducting transistor 100, consistent with an illustrative embodiment. Superconducting transistor 100 can be used to implement various superconducting circuits, including, without limitation, a Josephson Junction (JJ), superconducting capacitors, circulators, isolators, amplifiers, filters, etc.

The superconductor structure 100, may include a substrate 102. In various embodiments, the substrate 202, sometimes referred to herein as an intrinsic substrate, may comprise any suitable material or combination of materials, such as bulk intrinsic silicon, semiconductor on insulator (SOI), germanium (e.g., on a carrier substrate), or buried wells of silicon (Si) or Ge on a carrier. In another embodiment, the substrate may be silicon with silicon oxide, nitride, or any other insulating films on top. In another embodiment, the substrate 102 comprises intrinsic (i.e., undoped) silicon (Si). For example, the charge carrier density may be smaller at 0 gate voltage, but provides a mobility of the charge carriers that are in the channel. In one embodiment, the mean free path of the electrons in the channel region is comparable to the channel length (e.g., at most a few times smaller but not order(s) of magnitude smaller).

Thus, as used herein, the term substrate 102 refers to a foundation upon which various superconducting structures can be built.

There may be a first silicide 104A and a second silicide 104B located on opposite sides of a silicon channel 120 and on top of the substrate 102. In one embodiment, the width of the channel region 120 is below 1 um and preferably 100 nm or less. Such width is salient in comparison to the mean free path of the charge carriers in the channel material.

For example, the first silicide 104A may be a source and the second silicide 104B is a drain of the superconductor transistor 100. The first and second silicides 104A and 104B are collectively referred to herein as the silicides 104 of the transistor. In one embodiment, silicides having a low work function (e.g., ~4 eV and/or <5 eV) are used. Silicides of high quality (e.g., in a crystallographic sense and providing a low resistance) may be used. For example, silicides that may provide ambipolar operation, such as $Pt_xSi_y$, $Co_xSi_y$, $Ni_xSi_y$, $Mo_xSi_y$, $V_xSi_y$, $Ti_xSi_y$, $Sm_xSi_y$, $Er_xSi_y$, $Yb_xSi_y$, $Y_xSi_y$, $Zr_xSi_y$, etc., may be used. The thickness of the silicide 104 may vary depending on material used and/or the specific use of the superconducting transistor 100, and may be in the range of 1 nm to 100 nm. The silicide can be created by an annealing process, discussed in more detail below.

There may be a first superconducting contact 106A located on top of the first silicide 104A and a second superconducting contact 106B located on top of the second silicide 104B. The first and second superconducting contacts 106A and 106B are collectively referred to herein as superconducting contacts 106. In one embodiment, the superconducting contacts 106 have a high Tc (e.g., >1K). In various embodiments, the materials that may be used for the superconducting contacts may be, without limitation, niobium (Nb), niobium nitride (NbN), titanium nitride (TiN), vanadium (V), aluminum (Al), etc.

There may be a dielectric 108 located above the silicon channel region 120 and between the first and second superconducting contacts 106. For example, the gate dielectric may comprise, without limitation, silicon dioxide ($SiO_2$), silicon nitride (SiNx), hafnium oxide ($HfO_2$), aluminum oxide ($Al_2O_3$), etc. Multi-layer gate dielectrics 108 comprising a plurality of materials (e.g., where the top dielectric layer is high-K dielectric) are within the scope of the present application as well.

There is a gate 110 on top of the gate dielectric 108 that is operative to induce a channel in the channel region 120 between the first silicide 104A and the second silicide 104B when an appropriate voltage is applied to the gate 110.

In various embodiments, the gate may comprise platinum (Pt), TiN, palladium (Pd), or gold (Au) or poly-Si for better performance. In other embodiments, tantalum (Ta), tantalum nitride (TaN), niobium (Nb), or any other suitable material that is able to induce a gate channel can be used.

In one embodiment, the transistor channel region 120 comprises silicon (Si), germanium (Ge) or a combination thereof (e.g., SiGe). Different shapes of the transistor channel region 120 are within the scope of the present teachings, including, without limitation, fin, nanowire, nanosheet, heterostructure, quantum well. The channel region 120 can be fabricated on bare Si, SOI or Si epitaxial layers, etc. Accordingly, different shapes and substrate types are supported by the superconducting transistor 100.

In one aspect, contacting the transistor channel region 120 with work function matched silicide contacts 104A and 104B to allow for operation in the electron regime. The silicide contacts 104A and 104B are contacted with a large critical temperature Tc superconductor 106 to induce superconductivity in the contacts and consequently in the channel region 120. Such a device could be tuned between superconducting and insulating state with an appropriate voltage applied to the gate 110. In one embodiment, the device fabrication is fully CMOS compatible and can have an intrinsic Si substrate, thereby facilitating implementation of various quantum hardware, as described herein.

Example Processes for Superconducting Transistors

Figure 2A:
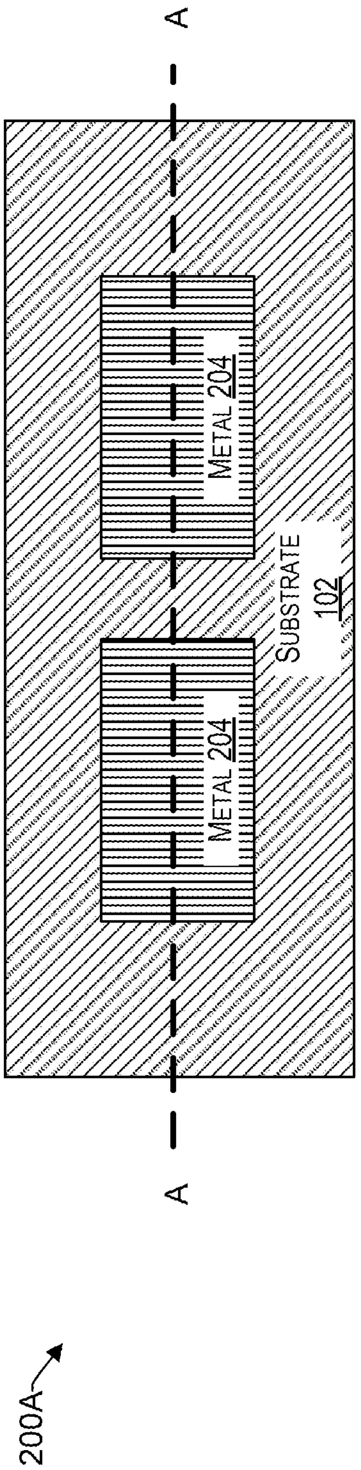
FIGS. 2A and 2B provide a top view and a cross-section view, respectively, of a semiconductor structure having a metal deposited on top of the substrate, consistent with an illustrative embodiment.
Figure 2B:
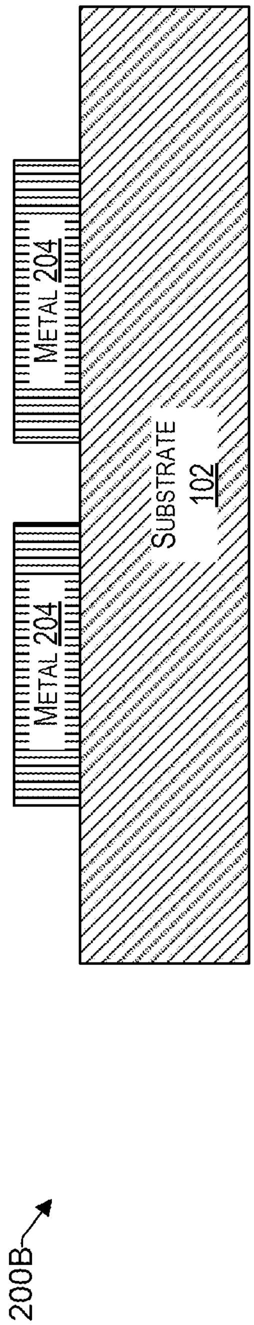

With the foregoing description of an example superconductor structure 100, it may be helpful to discuss example processes of manufacturing the same. To that end, FIGS. 2A to 10B illustrate various steps in the manufacture of superconducting transistors, consistent with illustrative embodiments. FIGS. 2A and 2B provide a top view 200A and a cross-section view 200B of a semiconductor structure having a metal deposited on top of the substrate. Metal structures 204 are patterned on a substrate 102. In one embodiment, the substrate is an intrinsic Si wafer. Different types of metals can be used, including, without limitation, nickel (Ni) or cobalt (Co) using lift-off or etching techniques. For example, in lift off lithography or lift-off process includes creating structures (patterning) of a target material (e.g., metal 204) on the surface of the substrate 102 using a sacrificial material (e.g., photoresist). It is an additive technique as opposed to more subtracting technique like etching. Alternatively, etching can be used by exposing a photoresist material to a pattern of light, and developing the exposed photoresist material. An etching process, such as a reactive ion etch (ME), may be used to form patterns (e.g., openings) by removing portions of the metal. After etching, the mask layer may be removed using a plasma ashing or stripping process. In one embodiment, the distance between the metal strips 204 in FIG. 200B is below 1 um and preferably 100 nm or less.

Figure 3A:
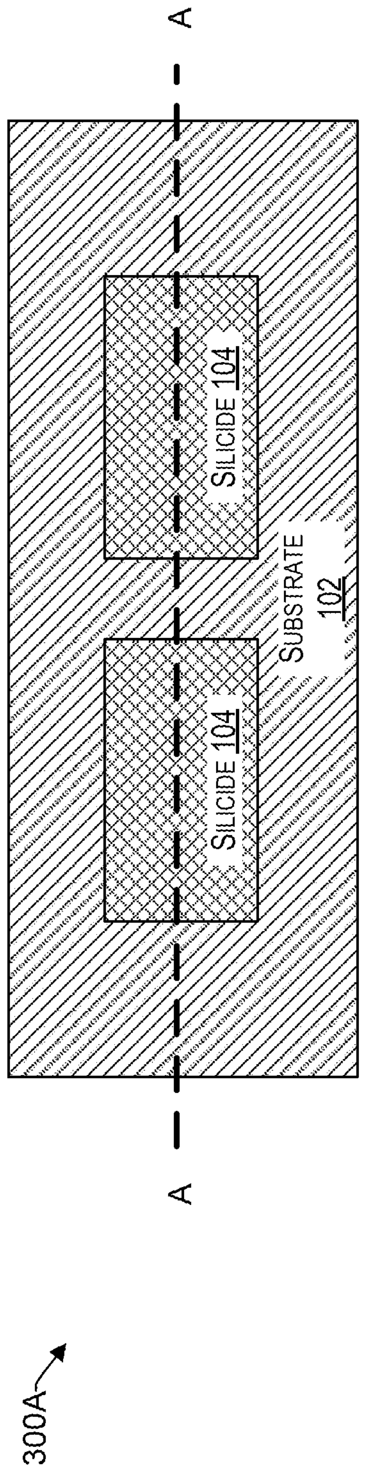
FIGS. 3A and 3B provide a top view and a cross-section view, respectively, of a semiconductor structure after an annealing process, consistent with an illustrative embodiment.
Figure 3B:
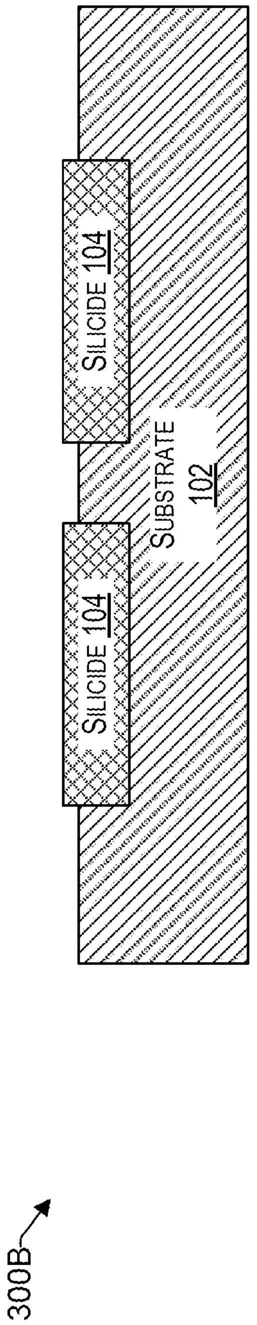

FIGS. 3A and 3B provide a top view 300A and a cross-section view 300B of a semiconductor structure after an annealing process, consistent with an illustrative embodiment. Annealing creates metal silicide areas 104, which serve as contacts to the substrate 102 (e.g., intrinsic Si) region. Metals and annealing conditions are selected such that the resulting silicide 104 allows carrier injection into the substrate 102. In various embodiments, different silicides can be formed, such as $Pt_xSi_y$, $Co_xSi_y$, $Ni_xSi_y$, $Mo_xSi_y$, $V_xSi_y$, $Ti_xSi_y$, $Sm_xSi_y$, $Er_xSi_y$, $Yb_xSi_y$, $Y_xSi_y$, $Zr_xSi_y$, etc. By way of example, for formation of NiSi, annealing parameters of a temperature of 400 C, atmosphere conditions of a gas mixture of $ArH_2$, and a duration of 30 seconds can be used.

Figure 4A:
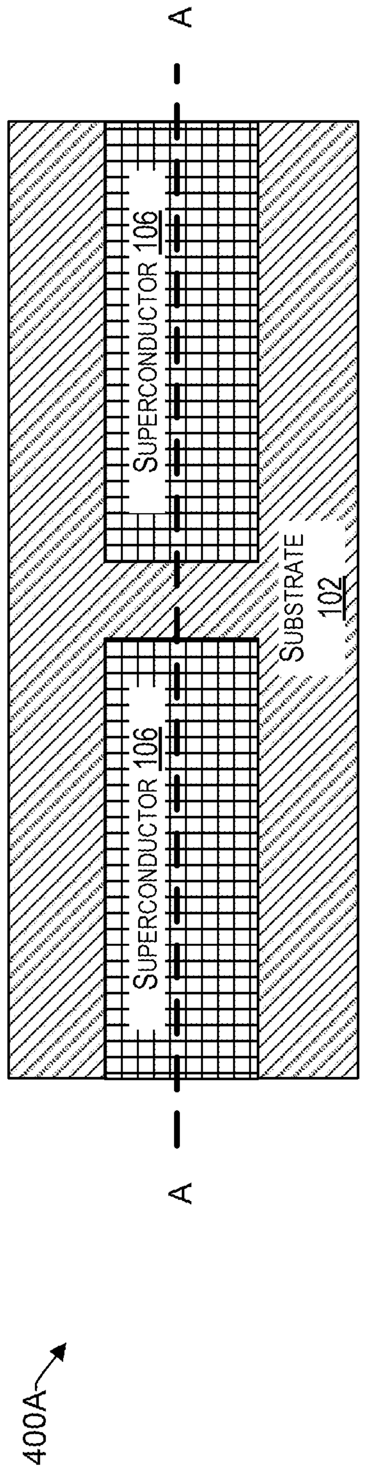
FIGS. 4A and 4B provide a top view and a cross-section view, respectively, of a semiconductor structure after a deposition of a superconductor, consistent with an illustrative embodiment.
Figure 4B:
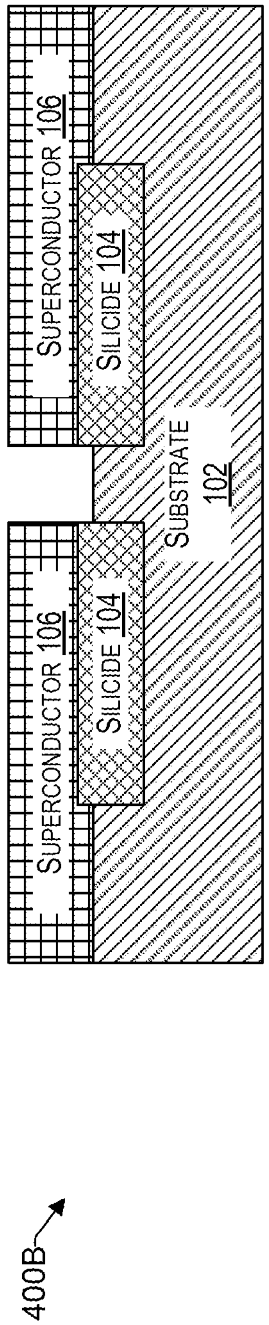

FIGS. 4A and 4B provide a top view 400A and a cross-section view 400B, respectively, of a semiconductor structure after a deposition of a superconductor 106, consistent with an illustrative embodiment. In one embodiment, a superconductor 106 having a critical temperature $T_c$>1 K is provided by way of deposition. Materials that can be used include, without limitation, niobium (Nb), niobium nitride (NbN), titanium nitride (TiN), vanadium (V), aluminum (Al), etc.

Figure 5A:
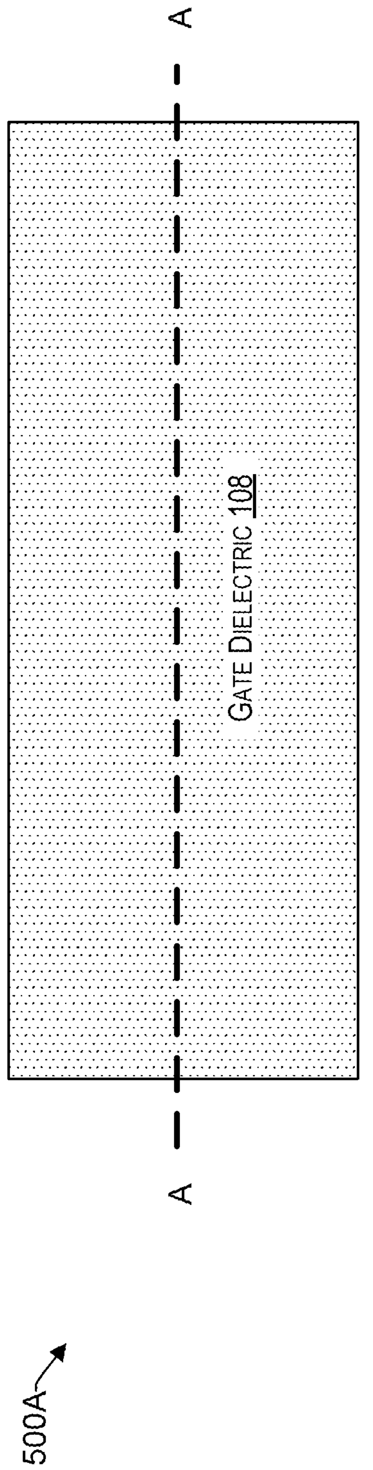
FIGS. 5A and 5B provide a top view and a cross-section view, respectively, of a semiconductor structure having a gate dielectric, consistent with an illustrative embodiment.
Figure 5B:
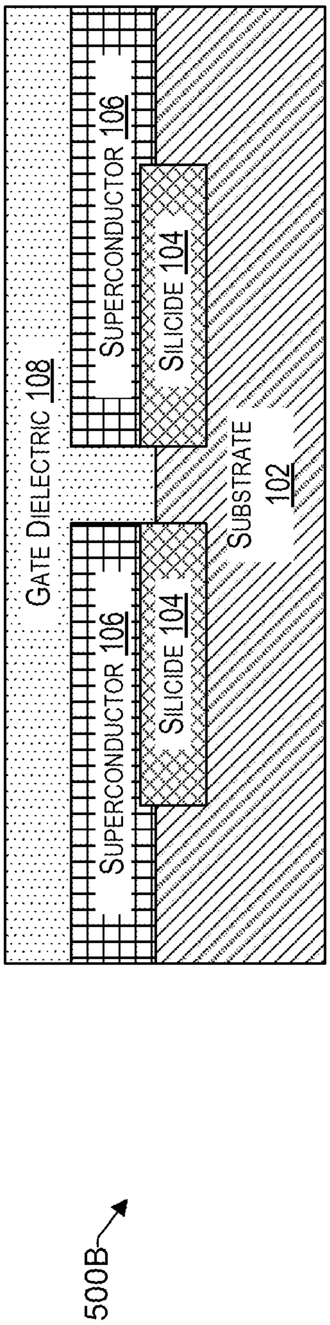

FIGS. 5A and 5B provide a top view 500A and a cross-section view 500B, respectively, of a semiconductor structure having a gate dielectric 108, consistent with an illustrative embodiment. In various embodiments, the gate dielectric may comprise, without limitation, $SiO_2$, $SiN_x$, $HfO_2$, $Al_2O_3$, etc.

Figure 6A:
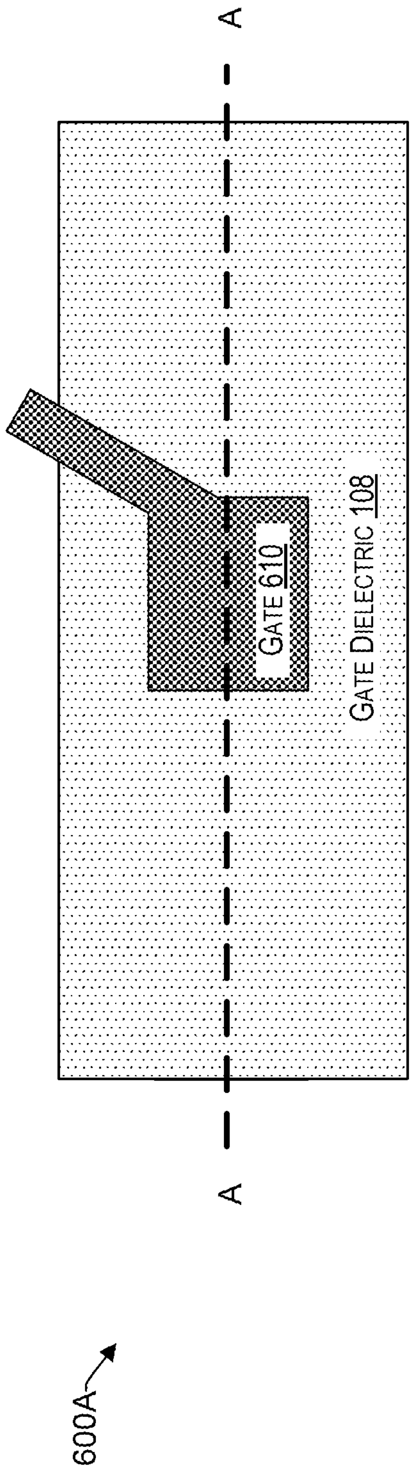
FIGS. 6A and 6B provide a top view and a cross-section view, respectively, of a semiconductor structure having a gate on top of a gate dielectric, consistent with an illustrative embodiment.
Figure 6B:
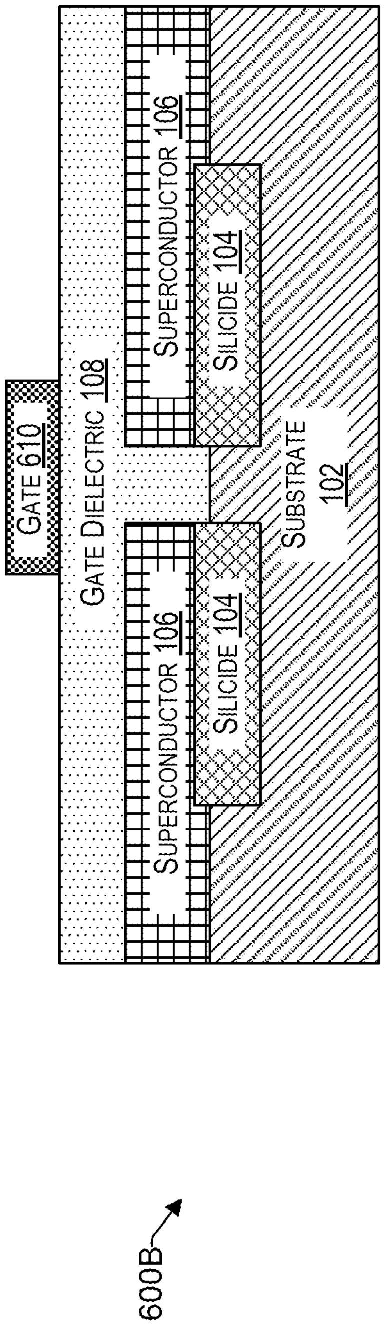

FIGS. 6A and 6B provide a top view 600A and a cross-section view 600B of a semiconductor structure having a gate 610, sometimes referred to herein as a gate electrode, on top of a gate dielectric 108, consistent with an illustrative embodiment. In various embodiments, the gate 610 may comprise, without limitation, platinum (Pt), TiN, etc., by way of etching or lift-off process.

Figure 7A:
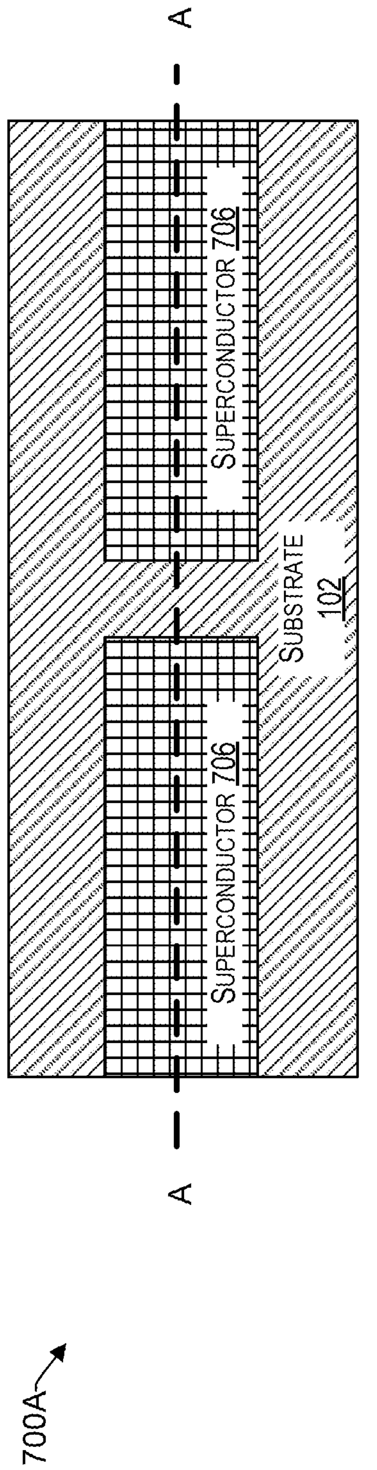
FIGS. 7A and 7B provide a top view and a cross-section view, respectively, of a semiconductor structure having a metal and superconductor deposited in a single step, consistent with an illustrative embodiment.
Figure 7B:
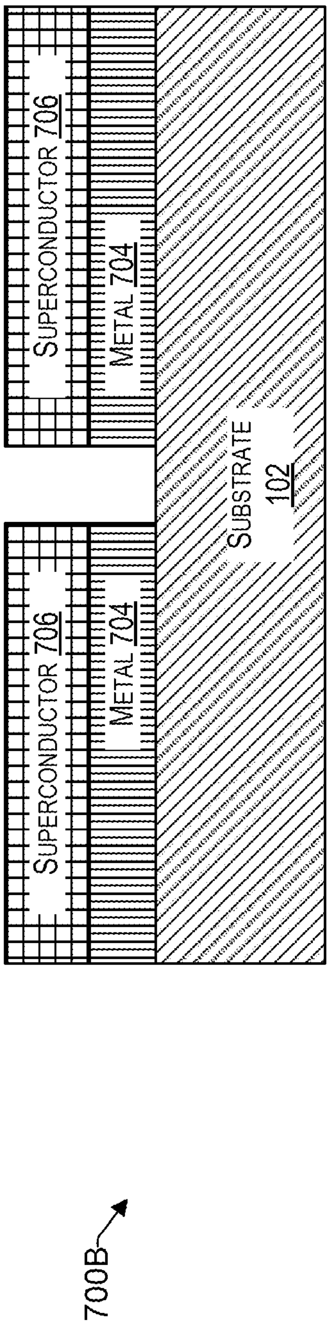

In the description of the semiconductor process for the formation of a superconducting transistor structure above, it has been shown that the deposition of the metal layer 204 and the superconductor layer 106 can be performed as different processing steps. It may be beneficial to do so in various scenarios. For example, certain superconductors 106 may be fragile and more sensitive to subsequent processing steps if deposited concurrently with the metal layer 204 before formation of the silicide 104. By virtue of depositing the superconductor 106A after the metal 204 is annealed to become a silicide 104, many of these concerns are alleviated. However, in other embodiments it may be beneficial to deposit the metal and superconductor layers at the same time (i.e., concurrently), thereby reducing processing steps and ultimately fabrication complexity and cost. In this regard, reference is made to FIGS. 7A and 7B provide a top view 700A and a cross-section view 700B of a semiconductor structure having a metal 704 and superconductor 706 deposited in a single step, consistent with an illustrative embodiment. As used herein, the term "single step" relates to a single processing step. For example, the materials are deposited in the same chamber consecutively without breaking the vacuum. In one embodiment, the metal layer comprises titanium (Ti) and the superconductor 706 may comprise titanium nitride (TiN).

Figure 8A:
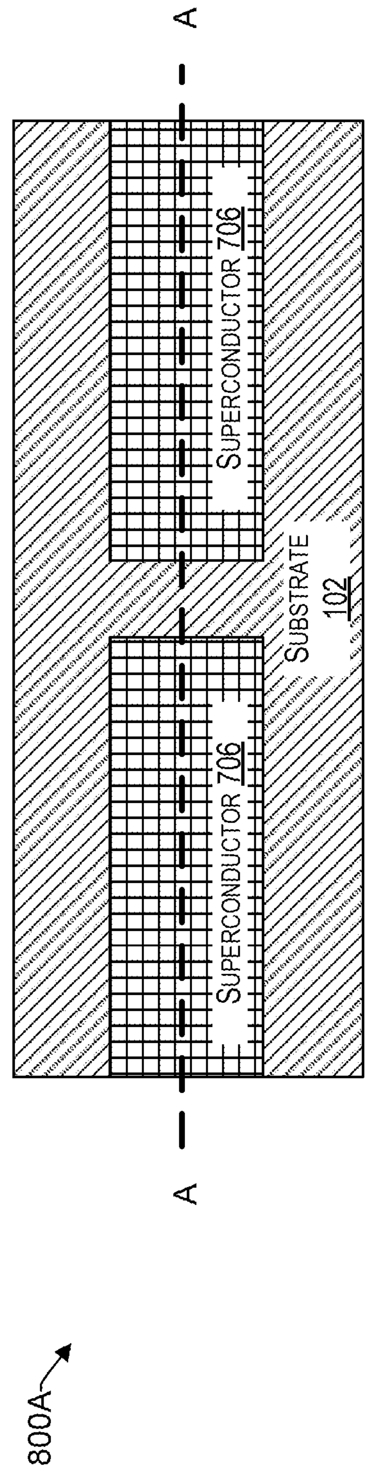
FIGS. 8A and 8B provide a top view and a cross-section view, respectively, of a semiconductor structure where a silicide is formed from a metal layer after an anneal, consistent with an illustrative embodiment.
Figure 8B:
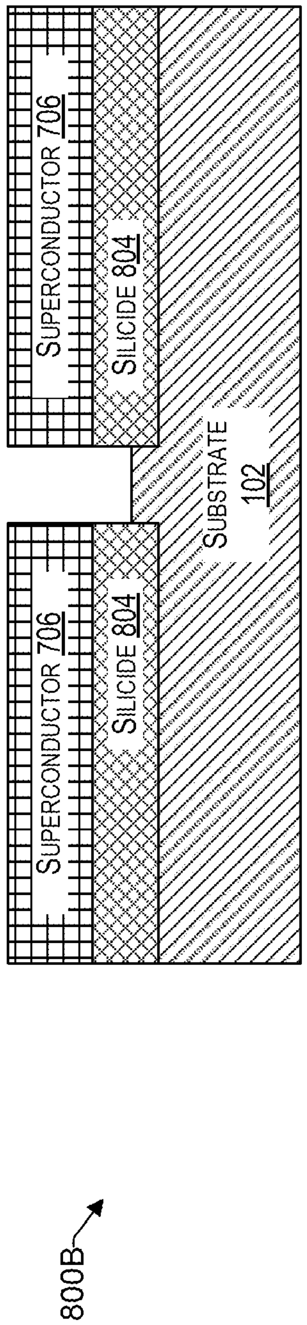
Figure 9A:
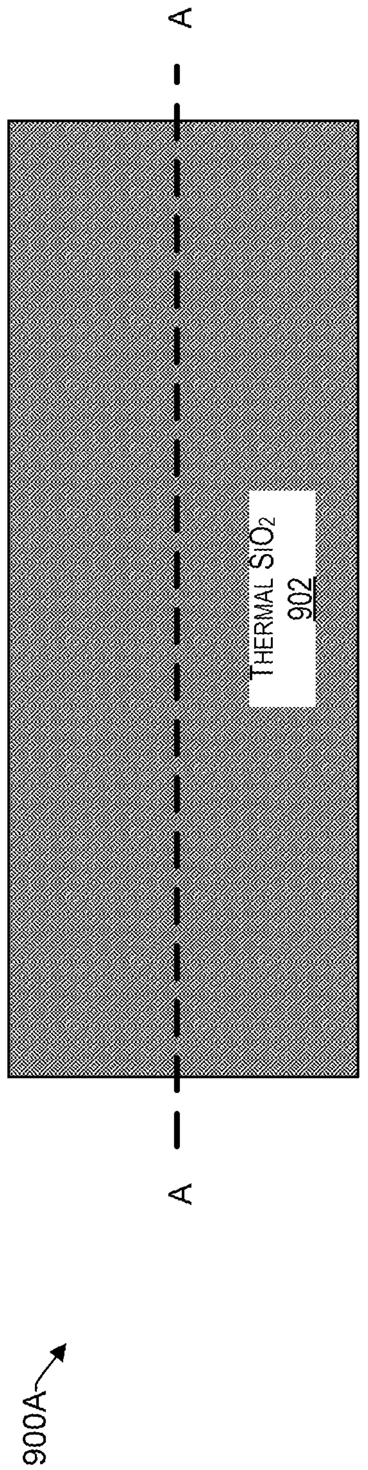
FIGS. 9A and 9B, which provide a top view and a cross-section view, respectively, of a semiconductor structure having a thick silicon oxide layer deposited on the substrate.
Figure 9B:
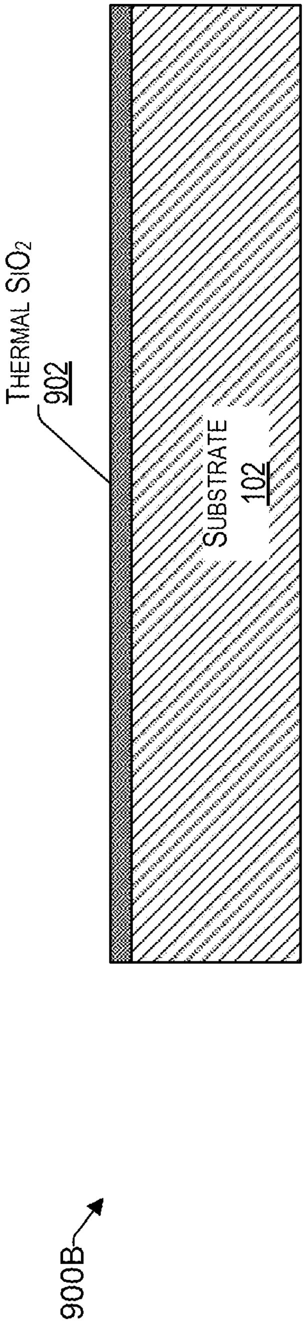

The joint metal 704 and superconductor 706 structure can then be annealed together to form a silicide 804 with substrate 102 (e.g., intrinsic Si), while the superconductor would stay in place, as illustrated in the top view 800A and cross-section view 800B of FIGS. 8A and 8B, respectively. In this way, the joint metal/superconductor structure 704/706 is annealed to create a superconductor 706 on top of the silicide 804 that is embedded at least in part in the substrate 102.

In one embodiment, the channel region is protected prior to the metal deposition by way of a silicon oxide layer. In this regard, reference is made to FIGS. 9A and 9B, which provide a top view 900A and a cross-section view 900B, respectively, of a semiconductor structure having a silicon oxide layer on the substrate 102. In one example, this silicon oxide can be thermal silicon oxide and the growth of the thermal oxide can be performed at a temperature of −1000 C in an oxygen atmosphere. The oxide layer 902 may comprise silicon dioxide ($SiO_2$) (thermal or deposited) and have a thickness of approximately 1-50 nm.

Figure 10A:
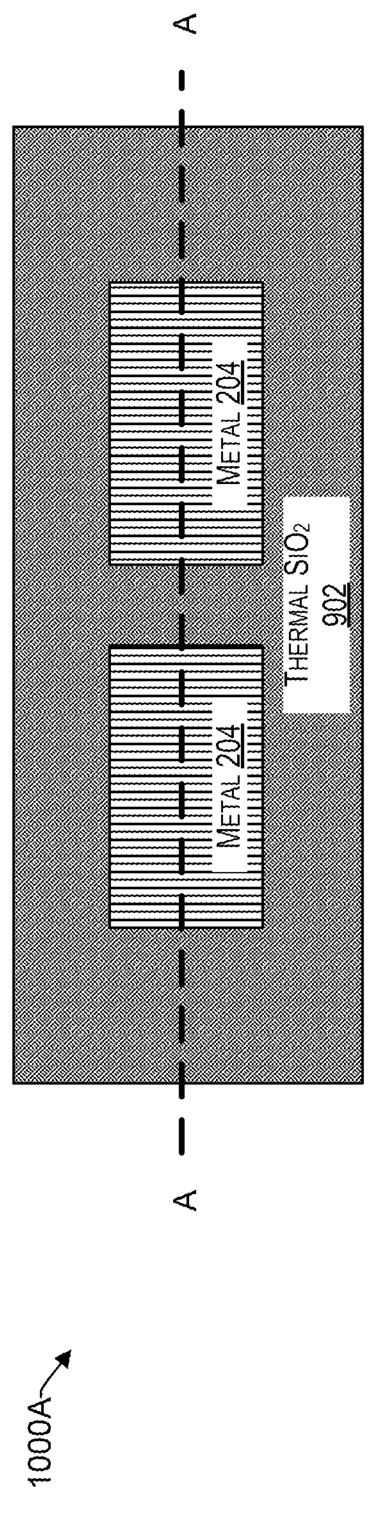
FIGS. 10A and 10B provide a top view and a cross-section view, respectively, of a semiconductor structure having the thick oxide layer removed in certain regions and a deposition of metal in those regions, consistent with an illustrative embodiment.
Figure 10B:
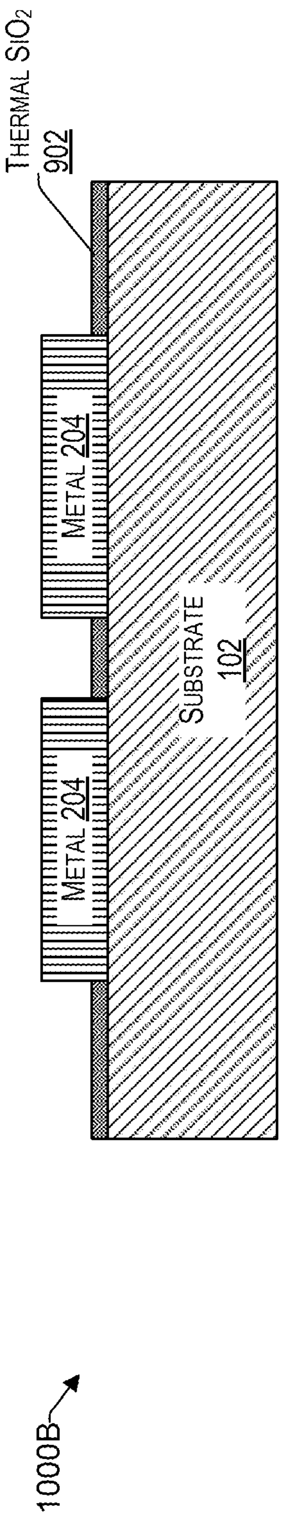

Certain portions of the oxide layer 902 can be removed to facilitate the deposition of metal structures directly on top of the substrate. In this regard, FIGS. 10A and 10B provide a top view 1000A and a cross-section view 1000B, respectively, of a semiconductor structure having the oxide layer removed in certain regions and a deposition of metal in those regions, consistent with an illustrative embodiment. For example, hydrofluoric acid can be used to etch the thermal oxide 902 such that the metal layer can be deposited directly on top of the substrate 102 in the exposed areas. The remaining processing steps are substantially similar to those discussed hereinabove and therefore not repeated for brevity.

While the manufacture of a single superconducting transistor structure is described for the purposes of discussion, it will be understood that other configurations, as well as those having multiple gates for individual barrier tuning and/or transistors are supported by the teachings herein. The superconducting transistor described herein can be integrated in another device such as, for example, a microwave resonator that may be tunable, waveguide, a superconducting quantum interference device (SQUID), etc. In one embodiment, the superconducting transistor could be used to implement a superconducting quantum interference device, which may be magnetic field tunable. Countless other implementations are of course possible.

For example, the method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A superconductor device, comprising:

a substrate that comprises undoped silicon;

a first silicide region comprising a first silicide and a second silicide region comprising a second silicide located on opposite sides of a silicon channel and on top of the substrate, wherein the first silicide and the second silicide are in direct contact with the undoped silicon;

a first superconducting contact in contact with the first silicide region;

a second superconducting contact in contact with the second silicide region;

a gate dielectric located between the first superconducting contact and the second superconducting contact and in contact with the first silicide region, the second silicide region, and the substrate, wherein the gate dielectric entirely fills a gap between a first sidewall of the first superconducting contact and a second sidewall of the second superconducting contact, wherein the gap extends from the first sidewall of the first superconducting contact to the second sidewall of the second superconducting contact; and a gate in contact with the gate dielectric.

2. The superconductor device of claim 1, wherein the first silicide and the second silicide have a work function that is less than 5 eV.

3. The superconductor device of claim 1, wherein the first silicide and the second silicide comprise $Pt_xSi_y$, $Co_xSi_y$, $Ni_xSi_y$, $Mo_xSi_y$, $V_xSi_y$, $Ti_xSi_y$, $Sm_xSi_y$, $Er_xSi_y$, $Yb_xSi_y$, $Y_xSi_y$, or $Zr_xSi_y$).

4. The superconductor device of claim 1, wherein the first superconducting contact and the second superconducting contact have a critical temperature $T_c$ above 1K.

5. The superconductor device of claim 1, wherein:

the first superconducting contact and the second superconducting contact comprise at least one of niobium (Nb), niobium nitride (NbN), titanium nitride (TiN), vanadium (V), aluminum (Al); and the gate comprises at least one of platinum (Pt), titanium nitride (TiN), gold (Au), or palladium (Pd).

6. The superconductor device of claim 1, wherein the superconductor device is part of a Josephson junction (JJ) having a gate-tunable critical current.

7. The superconductor device of claim 1, wherein a width of a channel region between the first silicide region and the second silicide region is 100 nm or less.

8. A quantum transistor device, comprising:

a substrate that comprises undoped silicon;

a first silicide region comprising a first silicide and a second silicide region comprising a second silicide located on opposite sides of a silicon channel and on top of the substrate, wherein the first silicide and the second silicide are in direct contact with the undoped silicon;

a first superconducting contact in contact with the first silicide region;

a second superconducting contact in contact with the second silicide region;

a dielectric located between the first superconducting contact and the second superconducting contact and in contact with the first silicide region, the second silicide region, and the substrate, wherein the dielectric entirely fills a gap between a first sidewall of the first superconducting contact and a second sidewall of the second superconducting contact, wherein the gap extends from the first sidewall of the first superconducting contact to the second sidewall of the second superconducting contact; and a gate in contact with the dielectric.

9. The quantum transistor device of claim 8, wherein the first silicide and the second silicide have a work function that is less than 5 eV.

10. The quantum transistor device of claim 8, wherein the first silicide and the second silicide comprise $Pt_xSi_y$, $Co_xSi_y$, $Ni_xSi_y$, $Mo_xSi_y$, $V_xSi_y$, $Ti_xSi_y$, $Sm_xSi_y$, $Er_xSi_y$, $Yb_xSi_y$, $Y_xSi_y$, or $Zr_xSi_y$).

11. The quantum transistor device of claim 8, wherein the first superconducting contact and the second superconducting contact have a critical temperature $T_c$ above 1K.

12. The quantum transistor device of claim 8, wherein:

the first superconducting contact and the second superconducting contact comprise at least one of niobium (Nb), niobium nitride (NbN), titanium nitride (TiN), vanadium (V), aluminum (Al); and the gate comprises at least one of platinum (Pt), titanium nitride (TiN), gold (Au), or palladium (Pd).

13. The quantum transistor device of claim 8, wherein the quantum transistor device has a gate-tunable critical current.

14. The quantum transistor device of claim 8, wherein a width of a channel region between the first silicide region and the second silicide region is 100 nm or less.

15. A quantum chip, comprising:

a substrate that comprises undoped silicon;

a first silicide region comprising a first silicide and a second silicide region comprising a second silicide located on opposite sides of a silicon channel and on top of the substrate, wherein the first silicide and the second silicide are in direct contact with the undoped silicon;

a first superconducting contact in contact with the first silicide region;

a second superconducting contact in contact with the second silicide region;

a dielectric located between the first superconducting contact and the second superconducting contact and in contact with the first silicide region, the second silicide region, and the substrate, wherein the dielectric entirely fills a gap between a first sidewall of the first superconducting contact and a second sidewall of the second superconducting contact, wherein the gap extends from the first sidewall of the first superconducting contact to the second sidewall of the second superconducting contact; and a gate in contact with the dielectric.

16. The quantum chip of claim 15, wherein the first silicide and the second silicide have a work function that is less than 5 eV.

17. The quantum chip of claim 15, wherein the first silicide and the second silicide comprise $Pt_xSi_y$, $Co_xSi_y$, $Ni_xSi_y$, $Mo_xSi_y$, $V_xSi_y$, $Ti_xSi_y$, $Sm_xSi_y$, $Er_xSi_y$, $Yb_xSi_y$, $Y_xSi_y$, or $Zr_xSi_y$).

18. The quantum chip of claim 15, wherein the first superconducting contact and the second superconducting contact have a critical temperature $T_c$ above 1K.

19. The quantum chip of claim 15, wherein:

the first superconducting contact and the second superconducting contact comprise at least one of niobium (Nb), niobium nitride (NbN), titanium nitride (TiN), vanadium (V), aluminum (Al); and the gate comprises at least one of platinum (Pt), titanium nitride (TiN), gold (Au), or palladium (Pd).

20. The quantum chip of claim 15, wherein a width of a channel region between the first silicide region and the second silicide region is 100 nm or less.

* * * * *